United States Patent [19]
Kaneko

[11] Patent Number: 6,028,659
[45] Date of Patent: *Feb. 22, 2000

[54] SCANNING PROJECTION-EXPOSURE APPARATUS AND METHODS

[75] Inventor: Yasutoshi Kaneko, Yokohama, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/887,404

[22] Filed: Jul. 2, 1997

[30] Foreign Application Priority Data

Jul. 4, 1996 [JP] Japan ..................... 8-175067

[51] Int. Cl.[7] ............... G03B 27/42; G01B 11/00
[52] U.S. Cl. ............... 355/53; 356/400; 355/55
[58] Field of Search ............... 355/53, 72, 54, 355/55; 356/375, 399, 400, 401; 250/559.29, 559.3; 430/5

[56] References Cited

U.S. PATENT DOCUMENTS

| | | |
|---|---|---|
| 4,488,806 | 12/1984 | Takahashi et al. ............... 355/54 |
| 5,117,255 | 5/1992 | Shiraishi et al. ............... 355/53 |
| 5,194,893 | 3/1993 | Nishi ............... 355/53 |
| 5,473,410 | 12/1995 | Nishi ............... 355/53 |
| 5,543,921 | 8/1996 | Uzawa et al. ............... 356/401 |
| 5,617,182 | 4/1997 | Wakamoto et al. ............... 355/53 |
| 5,793,471 | 8/1998 | Kanda et al. ............... 355/53 |

*Primary Examiner*—Alan A. Mathews
*Attorney, Agent, or Firm*—Klarquist Sparkman Campbell Leigh & Whinston, LLP

[57] ABSTRACT

Apparatus and methods are disclosed for automatically performing detection of a possible exposure error before scanning exposure of a shot field on a substrate. Upon detection of a possible error, the apparatus will automatically continue an exposure sequence without stopping the apparatus. If the detected error is, e.g., a focusing error, the scanning direction for exposure of the shot field and all subsequent shot fields on the substrate are reversed. If the detected error is, e.g., a synchronization error between the mask and substrate, the prescan distance for the subject shot field is increased and the scanning direction for exposure of the shot field and all subsequent shot fields are reversed.

40 Claims, 4 Drawing Sheets

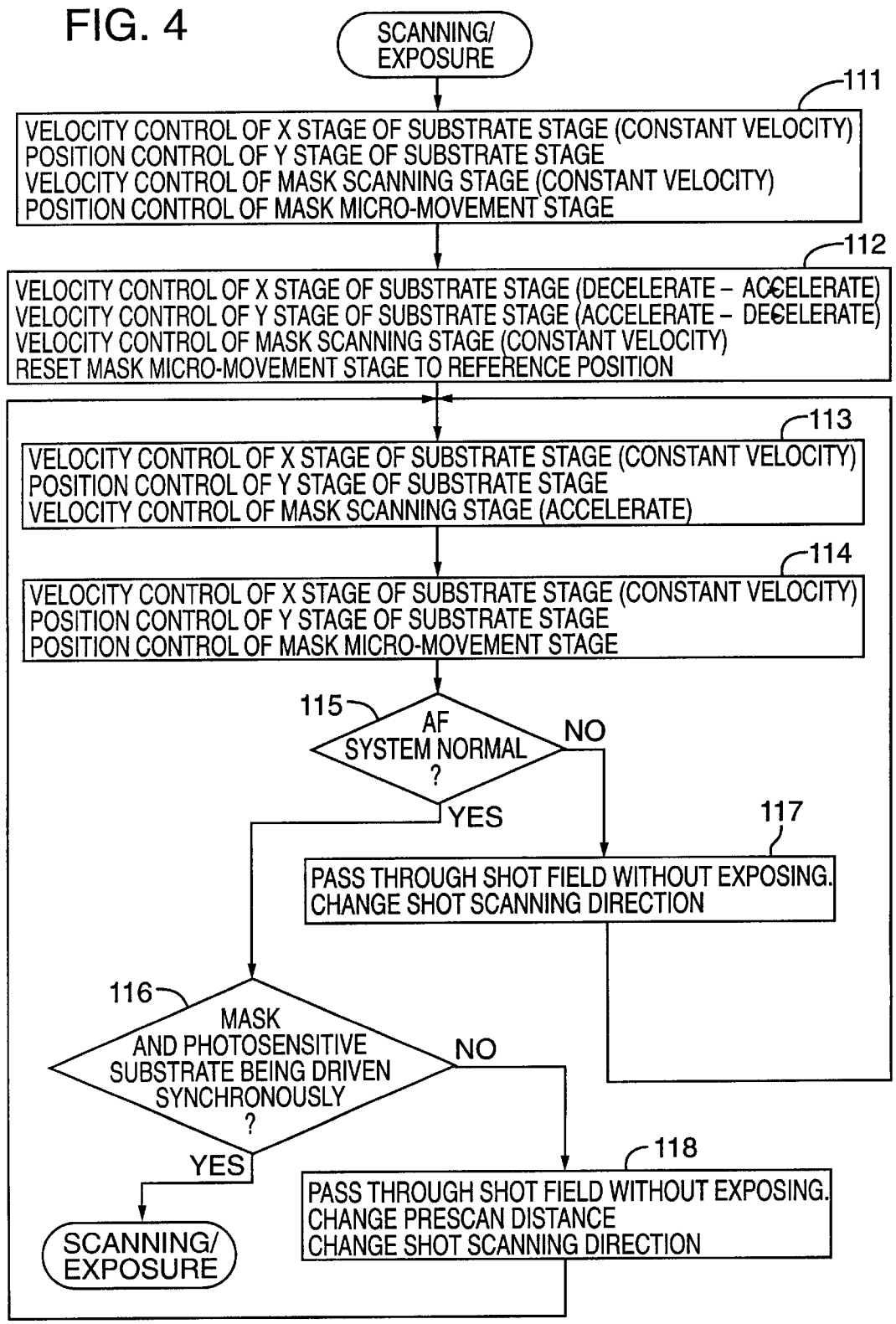

SCANNING PROJECTION-EXPOSURE APPARATUS AND METHODS

FIELD OF THE INVENTION

This invention pertains to projection-exposure apparatus and methods used in the manufacture of semiconductor devices and/or liquid crystal display devices, and the like, by a lithographic process, and specifically pertains to a scanning projection-exposure apparatus.

BACKGROUND OF THE INVENTION

When manufacturing semiconductor devices and/or liquid crystal display devices, and the like, using lithography techniques, a projection-exposure apparatus is normally used. A projection-exposure apparatus uses an illumination-light flux (produced by a light source and passed through an illumination-optical system) to project and expose a pattern defined on a photomask or reticle (hereinafter referred to as a "mask") via a projection-optical system onto respective "shot fields" (individual exposure regions each representing one "die") on a photosensitive substrate such as a semiconductor wafer or glass plate, etc. (hereinafter referred to as a "substrate") to which a photosensitive agent, such as a photoresist, etc., has been applied. (A "die" represents the area occupied by one device on the surface of the substrate.) For exposure, the illumination-light flux is projected using a projection-optical system. The mask and substrate are each supported on a separate mask stage and substrate stage, respectively. Since the illumination-light source, illumination-optical system, and projection-optical system are normally stationary, at least the substrate stage is movable to permit exposure of various shot fields on the substrate wafer surface.

One type of conventional projection-exposure apparatus is the so-called "step-and-repeat" type. With such an apparatus, a photosensitive substrate is mounted on a substrate stage that can move in two dimensions. An operation is sequentially repeated in which the photosensitive substrate is "stepped" (moved a predetermined amount in a lateral direction relative to the optical axis of the projection-exposure apparatus) by the substrate stage. After each step, the entire pattern defined by the mask is exposed onto the respective shot field on the photosensitive substrate. Such an apparatus is normally a "reducing" type in which the image of the pattern as formed on the substrate is smaller than the pattern defined by the mask.

Another type of conventional projection-exposure apparatus is the so-called "step-and-scan" type, most of which are "reducing" (by which is meant that the image of the mask pattern formed on the substrate by the projection-optical system has a smaller surface area than the mask pattern). Such apparatus reducingly project the mask pattern onto each shot field on the photosensitive substrate by scanning, but "step" from one shot field to the next. In step-and-scan exposure apparatus, after the next shot field on the photosensitive substrate has been step-shifted into the exposure field of the projection-optical system, the mask and substrate must be synchronously moved in order to effect scanning exposure of the shot field. Such synchronous scanning requires that each of the mask and substrate stages accelerate from a stationary condition and move at a constant velocity. While the stages are moving at a constant velocity, a shutter in the illumination-optical system opens to allow the illumination-light flux to make the exposure.

The period beginning the instant that acceleration of the stages begins up to the moment that the shutter opens for an exposure is termed the "prescan period". During the prescan period, a check is automatically made of whether or not the mask and substrate are being synchronously scanned. A check is also made using a focal-position detection system normally present in such apparatus. The focal-point detection system is operable to place the surface of the shot field at the best-focus plane of the projection-optical system.

During the prescan period, errors are sometimes detected that are due, for example, to an error in acquiring focal-position data, or an imperfect synchronization of the positions or velocities of the mask stage and substrate stage. In the past, the incidence of such errors during the prescan period required that operation of the exposure apparatus be stopped, the error condition be evaluated and corrected, and scanning exposure subsequently restarted from the shot position at which the error occurred. However, since error evaluation and correction must be performed manually with such apparatus, such tasks are troublesome. Also, since operation of the exposure apparatus must be stopped in order to perform error evaluation and correction, the productivity of the exposure apparatus is decreased.

SUMMARY OF THE INVENTION

This invention addresses the shortcomings of convention projection-exposure apparatus and methods, as summarized above. An object of the invention is to provide a step-and-scan exposure apparatus that is able to continuously execute an exposure sequence while automatically performing error processing, without stopping the apparatus even if an error occurs during the prescan period.

Focusing errors detected during prescan that involve the mask stage and substrate stage frequently arise because the shot field is located near the edge of the photosensitive substrate, which can cause the detection field of the auto-focus system to move off the surface of the photosensitive substrate. According to the present invention, focusing errors caused by the position of the shot field near the edge of the photosensitive substrate can be resolved by setting the scanning direction relative to that shot field in the opposite direction.

This invention was made in the course of research into the causes of the various types of focusing errors. The present invention provides a scanning projection-exposure apparatus that, while simultaneously scanning a mask and a photosensitive substrate, sequentially transfers the patterns on the mask via a projection-optical system onto multiple, respective shot fields arrayed on the photosensitive substrate. The scanning direction is changed to the opposite direction whenever a focusing error develops after initiation of scanning of the mask and photosensitive substrate but before actual exposure of the shot field begins.

The scanning direction of one shot is reversed for the purpose of error processing. But, in order to avoid decreases in throughput that could affect subsequent scan sequences, it is preferable to change the scanning direction for all shot fields scanned after the focusing error occurred to the direction opposite the initially set direction.

In addition, in step-and-scan projection-exposure apparatus, there are many cases in which errors due to imperfect synchronization in the positions or velocities of the mask stage on which the mask is mounted and the substrate stage on which the photosensitive substrate is mounted during prescanning of the mask stage and the substrate stage can be resolved by lengthening the prescanning distance to maintain a time margin for synchronization.

This invention arose from, inter alia, my research on methods for resolving these kinds of synchronization errors between the mask and substrate. Thus, the invention provides a scanning-exposure apparatus that, while simultaneously scanning a mask and a photosensitive substrate, sequentially transfers the patterns on the mask via a projection optical system onto multiple, respective shot fields arrayed on the photosensitive substrate. If an error condition that could affect exposure of the shot field is detected, such as an error in synchronization, the prescanning distance preset by the apparatus can be lengthened.

With this invention, error processing is performed automatically for focusing errors and synchronization errors (errors that have a high probability of resolution), even when errors occur during the prescan sequence, without having to stop the apparatus and perform error processing upon occurrence of every error, as in the past. Consequently, it is now possible in step-and-scan photolithography for the sequence of exposing multiple shot fields on a substrate to continue unaltered in cases where the cause of an error has been resolved by this automatic error processing. Thus, decreased throughput due to errors can be kept to a minimum.

The foregoing and additional features and advantages of the invention will be more apparent from the following detailed description that proceeds with reference to the accompanying drawings.

BRIEF DESCRIPTION OF THE DRAWINGS

FIG. 4 is a flow chart showing an exemplary control method for scanning exposure according to the invention.

DETAILED DESCRIPTION OF THE PREFERRED EMBODIMENTS

Figure 1:
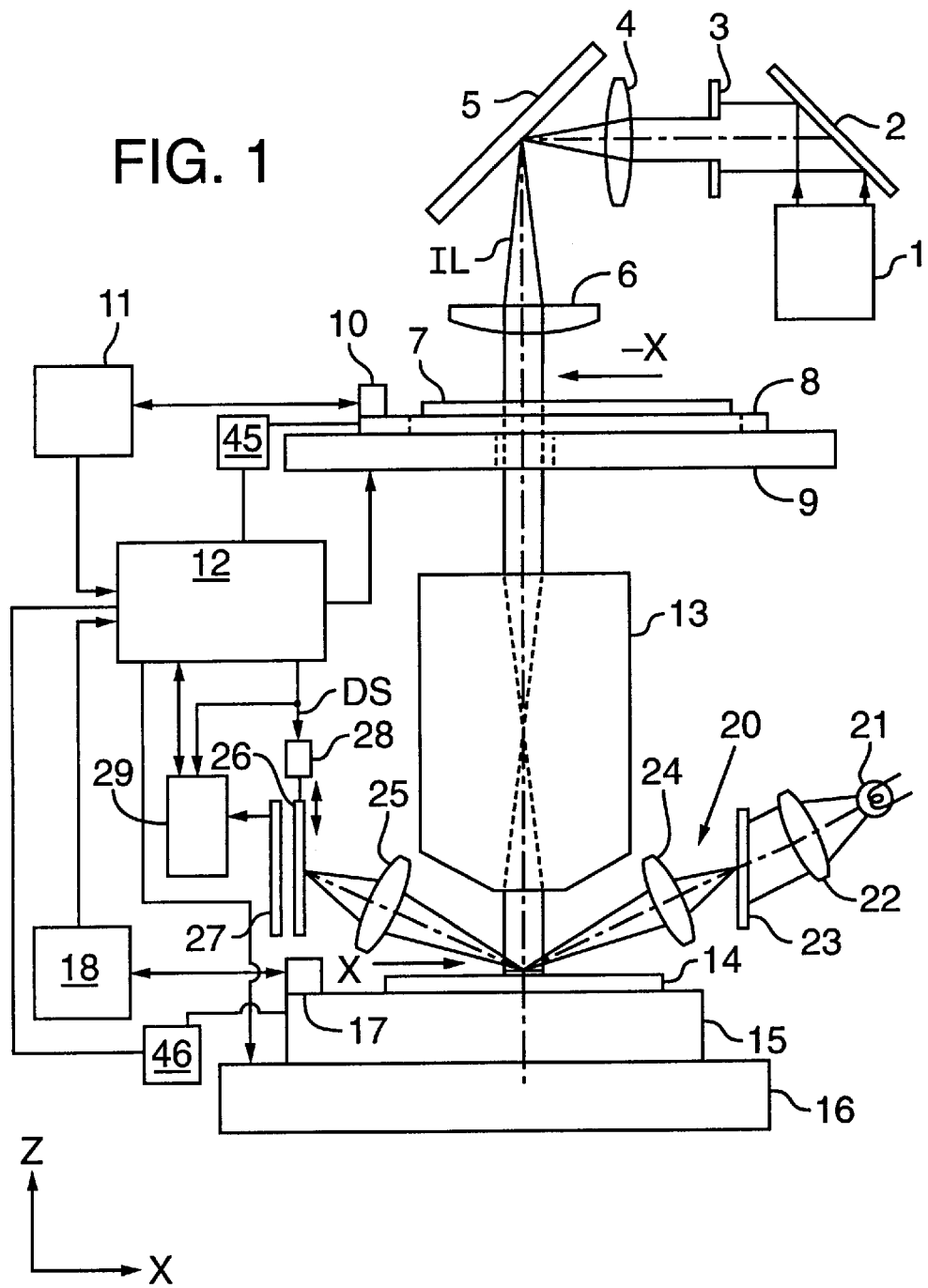
FIG. 1 is a schematic elevational view of a preferred embodiment of a step-and-scan projection-exposure apparatus according to this invention.

A preferred embodiment of a step-and-scan projection-exposure apparatus according to the invention is shown in FIG. 1. Illumination light IL is produced by a light source 1. The illumination light IL reflects from a mirror 2, passes through a field aperture 3 and a relay lens 4, reflects from a mirror 5, passes through a condenser lens 6, and illuminates a mask 7 at a uniform irradiance. The mirror 2, field aperture 3, relay lens 4, mirror 5, and condenser lens 6 comprise an "illumination-optical system". The light source 1 comprises a mercury lamp or laser light source as well as an optical integrator or analogous component. The plane in which the field aperture 3 is arranged is conjugate with the patterned surface (preferably the lower surface) of the mask 7. A slit-shaped illumination field on the mask 7 is defined by the field aperture 3.

In FIG. 1, with respect to a plane parallel with the mask 7, a direction parallel with the surface of the page is the X direction and the direction perpendicular to the surface of the page is the Y direction. The length-wise direction of the slit-shaped illumination field extends in the Y direction, and the relative scanning direction of the mask 7 and the slit-shaped illumination field is the X direction. The direction of the optical axis of the projection-optical system 13, perpendicular to the X and Y directions, is the Z direction.

The mask 7 is held on a mask stage 8 that moves and rotates in the X direction and Y direction. The mask stage 8 is supported by a mask-stage base 9 so that the mask stage 8 can move freely. The mask stage 8 preferably comprises a "mask-scanning stage" (not detailed in FIG. 1) for scanning in the X direction and a mask "micro-movement stage" (not detailed in FIG. 1) situated above the mask-scanning stage that performs fine adjustments of the mask 7 both in the X direction and rotationally (θ direction). Movement of the mask stage 8, the mask-scanning stage, and the mask micro-movement stage is effected by a mask-stage drive system 45 controlled by a main control system 12.

A movable mirror 10 is attached to an X-direction edge of the mask stage 8. A laser beam from an X-axis laser interferometer 11 is reflected by the movable mirror 10. The X-axis laser interferometer 11 detects the coordinate in the X direction of the mask stage 8 by photoelectrically converting an interference beam (produced by interference of a laser beam reflected from the movable mirror 10 and a laser beam reflected from a reference mirror) to positional information. The coordinate of the mask in the Y direction and the rotational angle of the mask stage 8 are measured by an electrostatic capacitance sensor (not shown in the figure).

The measured coordinate from the X-axis laser interferometer 11 and the measurement results from the electrostatic capacitance sensor are supplied to the main control system 12. The main control system 12 sets the movement velocity, position, and rotational angle of the mask stage 8 according to the exposure sequence.

The image of the pattern on the mask 7 is projected and exposed onto the photosensitive substrate 14 by the illumination light IL via a projection-optical system 13. The conjugate image of the slit-shaped illumination field on the mask, i.e., the exposure field of the projection-optical system 13, is smaller than one shot field on the photosensitive substrate 14. Consequently, the photosensitive substrate 14 is scanned in, e.g., the +X direction at a constant velocity in synchrony with scanning of the mask 7 in the −X direction. Such synchronous scanning achieves exposure of each complete shot field on the photosensitive substrate 14. To accomplish scanning, the photosensitive substrate 14 is held on a substrate stage 15 that moves freely in the X and Y directions relative to a base 16. The substrate stage 15 comprises an "X stage" (not detailed in FIG. 1) movable in the X direction and a "Y stage" (not detailed in FIG. 1) movable in the Y direction, as effected by substrate-stage drive system 46 controlled by the main control system 12.

A movable mirror 17 is attached to an X-direction edge of the substrate stage 15. A laser beam from an X-axis laser interferometer 18 is reflected by the movable mirror 17. Although not shown in the figure, a movable mirror is also attached to the substrate stage 15 at a Y-direction edge; a laser beam from a Y-axis laser interferometer is reflected by the movable mirror. The X-axis laser interferometer 18 and the Y-axis laser interferometer detect the X coordinate and Y coordinate, respectively, of the substrate stage 15 by photoelectrically converting the respective interference beams to positional information.

The detected X and Y coordinates of the substrate stage 15 are supplied to the main control system 12. The main control system 12 sets the movement velocity and position of the substrate stage 15 according to the exposure sequence.

The FIG. 1 apparatus includes a focal-position detection system (AF sensor) 20 for detecting the position, in the Z direction, of the surface of the photosensitive substrate 14 relative to the projection-optical system 13. A detection light that is not reactive with the photoresist is irradiated from a light source 21. The detection light is directed by a condenser lens 22 onto a slit in a transmission slit plate 23. The image of the slit is projected at an angle to the optical axis of the projection-optical system 13 by an objective lens 24 onto a measurement locus on the photosensitive substrate 14. The reflected light from the measurement locus is focused by a focusing lens 25 onto an oscillating slit plate 26, again forming an image of the slit image projected onto the measurement locus.

The oscillating slit plate 26 is oscillated in a specified direction by an oscillator 28 driven by a drive signal DS from the main control system 12. Light that has passed through the slit in the oscillating slit plate 26 is photoelectrically converted by a photoelectric conversion element on a photoelectric detector 27. The resulting photoelectric conversion signal is supplied to a signal-processing system 29. After processing, the signal is routed to the main controller 12. The AF sensor 20 is calibrated so that the focal-position signal is 0 [zero] when the measurement locus on the photosensitive substrate 14 is aligned with the best focus plane of the projection-optical system 13.

During exposure of each shot field, the photosensitive substrate 14 is scanned at a constant velocity in the +X direction so that the amount of illumination received by each of various points within the shot field is constant. Velocity control is performed based on the measurement data obtained by the laser interferometer 18. Concretely, filtering is performed that is suited to the integrated coordinate data in the +X direction (as determined by the laser interferometer 18). The X stage of the substrate stage 15 is controllably driven so that the coordinate in the X direction remains constant. Meanwhile, where the reduction ratio of the projection-optical system 13 from the mask 7 to the photosensitive substrate 14 is $\beta$ ($\beta<1$), a difference is calculated between the value of the measurement results obtained by the laser interferometer 18 multiplied by the magnification ratio $1/\beta$ and the measurement results obtained by the laser interferometer 11. Scanning of the mask in the −X direction is performed under positional control such that this difference equals 0 [zero].

Figure 2:
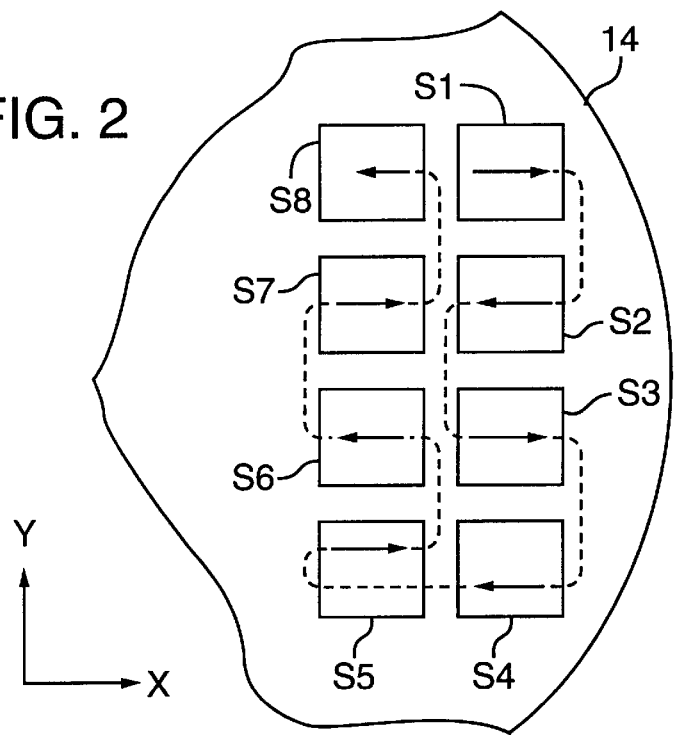
FIG. 2 shows a representative scheme for sequentially scanning multiple shot fields on a photosensitive substrate using an apparatus according to the invention.

FIG. 2, shows an example of the scanning directions on various shot fields S1, S2, S3, . . . , as the photosensitive substrate 14 is scanned and exposed. The solid arrow within each shot field indicates the scanning direction for the respective shot field (i.e., the direction in which the exposure field is swept across the region occupied by the respective shot field). The dashed lines connecting the arrows indicate movement of the exposure field between the shot fields (actually, the exposure field is not formed between shots since the shutter in the illumination-optical system is closed during the time that exposure of a shot field is not occurring).

Normally, to minimize movement of the mask, one shot field is scanned and exposed during a scanning movement of the mask in one direction, and the next shot field is scanned and exposed during a scanning movement of the mask in an opposite direction ("return direction"). Thus, two shot fields are exposed per "round-trip" scanning movement of the mask 7. In such a scheme, +X-direction scans and −X-direction scans are alternately repeated in successive shots; e.g., if the shot field S1 is scanned in the +X direction, as shown in FIG. 2, the next shot field S2 is scanned in the −X direction, the shot field S3 is scanned in the +X direction, and the shot field S4 is scanned in the −X direction, and so on.

Figure 3A:
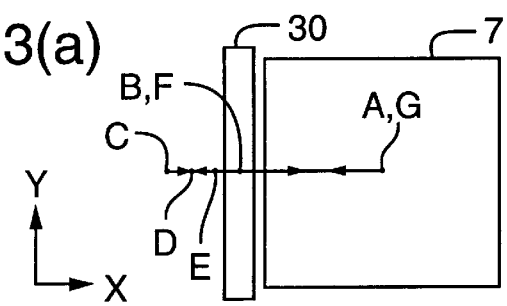
FIG. 3(a) shows a representative relative positional relationship between a mask pattern and a slit-shaped illumination field, as achieved using an apparatus according to the invention.
Figure 3B:
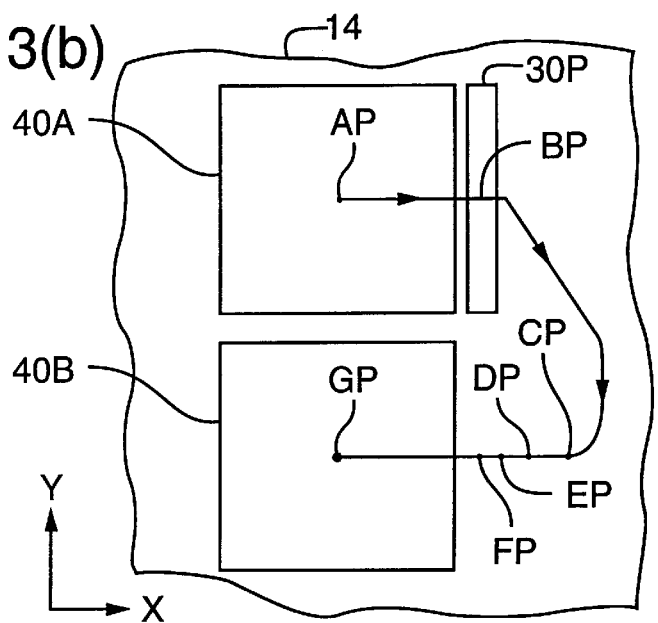
FIG. 3(b) shows a representative relative positional relationships between a substrate and a slit-shaped exposure field, as achieved using an apparatus according to the invention.

FIGS. 3 and 4 depict scanning of the mask and substrate in more detail. FIG. 3(a) shows the relative positional relationship between the mask 7 and the slit-shaped illumination field 30; and FIG. 3(b) shows the positional relationship between the photosensitive substrate 14 and the slit-shaped exposure field 30P. FIG. 4 is a flow chart showing an exemplary method, according to the invention, for controlling scanning exposure.

In a starting condition, the center of the illumination field 30 in FIG. 3(a) is at the center position A of the mask 7, and the center of the exposure field 30P is at the center position AP of the first shot field 40A on the photosensitive substrate 14.

Upon initiation of scanning exposure (step 111 in FIG. 4), the mask 7 is scanned in the +X direction at a velocity $V/\beta$, and the photosensitive substrate 14 is scanned in the −X direction at velocity V. These motions of the substrate stage and mask stage are controlled by the main control system 12. In order to drive the X stage of the substrate stage 15 at the constant velocity V, the main control system 12 samples the integrated X-coordinate data ($WS_x$) supplied from the laser interferometer 18 and generates an X-stage drive instruction to the substrate-stage drive system 46 so that this integral value $WS_x$ remains at a constant value corresponding to the velocity V. Simultaneously, in order to drive the mask-scanning stage at a constant velocity $V/\beta$, the main control system 12 samples the integrated X-coordinate data ($RS_x/\beta$) supplied from the laser interferometer 11 and generates a drive instruction to the mask-stage drive system 45 so that this integral value remains at a constant value corresponding to the velocity $V/\beta$.

Thus, the center of the illumination field 30 in FIG. 3(a) moves from position A to position B outside the mask 7, and the center of the exposure field 30P in FIG. 3(b) moves from position AP to position BP outside the first shot field 40A on the photosensitive substrate 14, thereby concluding the first scan and exposure.

Next, in step 112, the main control system 12 drives the X stage of the substrate stage 15 to decelerate the substrate stage 15 and then to accelerate the substrate stage 15 in the +X direction, and to accelerate and then decelerate the Y stage of the substrate stage 15 in the +Y direction. Simultaneously, the main control system 12 decelerates the mask-scanning stage of the mask stage 8 and resets the position of the mask micro-movement stage to its reference position. Thus, the center of the illumination field 30 stops when it reaches position C in FIG. 3(a), which is more distal to the mask than position B; in FIG. 3(b), the center of the exposure field 30P moves from position BP to position CP outside the second shot field 40B on the photosensitive substrate 14. At this position CP, the substrate stage 15 has already started scanning in the +X direction.

Next, in step 113, the main control system 12 drives the X stage of the substrate stage 15 in the +X direction at a constant velocity V, while the position of the Y stage in the Y direction is held stationary. This operation damps vibrations due to the acceleration and deceleration of the Y stage of the substrate stage 15. Simultaneously, the mask-scanning stage of the mask stage 8 accelerates in the −X direction.

Thus, in FIG. 3(a), the center of the illumination field 30 moves from position C to position D nearer the mask 7; meanwhile, in FIG. 3(b), the center of the exposure field 30P moves from position CP to position DP near the second shot field 40B. At position D, the mask stage starts to move at a constant velocity V/β in the +X direction. At this point in time, the relative scanning velocity of the photosensitive substrate 14 should have reached the design value, but it is possible that the relative positions of the mask 7 and photosensitive substrate 14 have shifted.

In step 114, the main control system 12 performs positional control of the Y stage of the substrate stage 15 and the micro-movement stage of the mask stage 8. In other words, the difference between the integrated X-coordinate $WS_x$ for the substrate side measured by the interferometer 18 and the X-coordinate data $RS_x/\beta$ on the mask side measured by the laser interferometer 11 ($WS_x - RS_x/\beta$), the difference between the Y-coordinate data $WS_y$ on the substrate side and the Y-coordinate data $RS_y/\beta$ on the mask side ($WS_y - RS_y/\beta$), and the difference between the rotational angle data $WS_\theta$ on the substrate side and the rotational angle data $RS_\theta$ on the mask side ($WS_\theta - RS_\theta$) are all sampled. The main control system 12 then issues a drive command to the substrate-stage drive system 46 that drives the Y stage of the substrate stage 15 so that the difference ($WS_y - RS_y/\beta$) is a specified value, and issues drive commands to the mask-stage drive system 45 (to actuate the mask micro-movement stage) so that the difference ($WS_x - RS_x/\beta$) and the difference ($WS_\theta - RS_\theta$) are specified values.

Thus, any unwanted positional shift of the mask 7 and the photosensitive substrate 14 relative to each other is corrected. At this time, the center of the illumination field 30 is in position E outside the pattern field on the mask 7, as shown in FIG. 3(a), and the center of the exposure field 30P is in position EP outside the second shot field 40B, as shown in FIG. 3(b). Then, when the center of the illumination field 30 is in position F immediately in front of the pattern field on the mask 7, as shown in FIG. 3(a), and the center of the exposure field 30P has advanced to position FP immediately in front of the second shot field 40B, as shown in FIG. 3(b), the constant velocity driving and positional shift correction of the mask 7 and photosensitive substrate 14 have been completed.

The AF sensor 20 initiates acquisition of focal-position data for the surface of the photosensitive substrate from the time that the exposure field 30P reaches, e.g., position DP. Also, the main control system 12 performs preparatory focus control according to the signal from the AF sensor 20. When the exposure field 30P has reached position EP immediately in front of the shot field 40B, in step 115, the main control system 12 checks whether or not focus control has been properly accomplished.

If focus control has been properly accomplished, a confirmation is made in the next step 116 of whether or not the mask 7 and the photosensitive substrate 14 are being synchronously driven. I.e., a check is made of whether or not the mask 7 and the photosensitive substrate 14 are being driven at respective constant velocities with correction of any unwanted positional shift. The check for whether or not positional shift correction has been completed is performed by ascertaining whether or not the three differences discussed above ($WS_x - RS_x/\beta$), ($WS_y - RS_y/\beta$), and ($WS_\theta - RS_\theta$) are at specified values. In addition, a velocity-synchronization check is performed by comparing the integrated X-coordinate data supplied from the laser interferometer 18 for the substrate side with the integrated X-coordinate data supplied from the laser interferometer 11 for the mask side.

If the result at step 116 is "YES", the illumination field 30 relatively scans the mask 7 to the center position G, as shown in FIG. 3(a), and the exposure field 30P relatively scans the second shot field 40B to the center position GP, as shown in FIG. 3(b). Then, by repeating the operation from step 111 on, pattern exposure is performed for the second shot field 40B and subsequent shot fields on the photosensitive substrate 14.

Next, processing for when the result at step 115 is "NO", i.e., what happens when a focusing error occurs, is described with reference to FIG. 5. Focusing errors can occur when attempting to scan and expose the shot fields S11, S12, S13, S14, . . . , situated along the edge of a photosensitive substrate 14. Initially, in the shot fields S11, S12, S13, . . . on the photosensitive substrate 14, the scanning direction is set for each shot field, and the main control system 12 scans and exposes each shot field according to that setting. The various scanning directions are set by this initial setting so that scanning in the +X direction and scanning in the -X direction are alternately repeated for consecutive shots, as explained in FIG. 2.

However, a case is considered in which, e.g., scanning and exposure of the shot field S13 is complete and scanning and exposure of the next shot field S14 is upcoming; i.e., prescanning is approaching shot field S14. During the prescan period prior to reaching the shot field S14, the AF sensor 20 of the exposure device is already acquiring focal-position data and performing preparatory focus control, as explained in with respect to FIG. 3(b). However, since the shot field S14 is located at the edge of the photosensitive substrate 14, the normal prescan path would extend over the edge of the photosensitive substrate and focal position data would not be obtainable.

In the past, an error would be detected in this kind of situation and the exposure apparatus would have stopped. However, in such a situation, processing according to the present invention would advance to step 117, where the scanning sequence passes through to the opposite side of the shot field S14 without exposing the shot field S14, as indicated by the dashed line L1, and all subsequent scanning directions that are set after that shot attempt are assigned reverse directions from the initial directions. Thereafter, processing returns to step 113 and prescanning to the shot field S14 is started from the opposite direction.

When the scanning direction is reversed, focal position data acquisition and preparatory focusing become possible because the prescan portion is located inside the photosensitive substrate 14, making it highly probable that the error will be resolved. By progressing through step 117, the result at step 115 becomes "YES". If the result at step 116 is "YES", then the shot field S14 is scanned and exposed from the direction opposite the initially set direction, as indicated by the dashed line L2. The shot field S15 is then scanned and exposed from the direction opposite the initially set direction, as indicated by the dashed line L3. All subsequent shot fields S16, S17, . . . will also be scanned and exposed from directions opposite the directions initially set by the apparatus.

Figure 6:
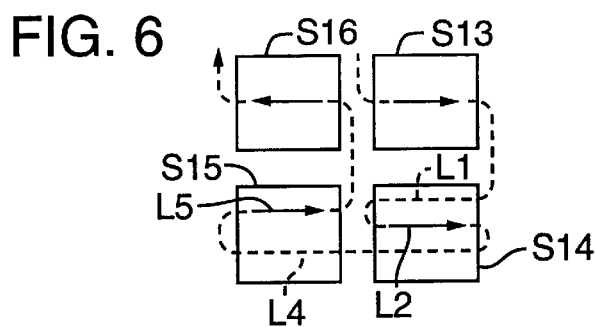
FIG. 6 depicts a representative scanning sequence that occurs after detection of an error.

The reason that the scanning directions for the shot field S14 and for all subsequent shot fields S15, etc., are changed to an opposite direction in step 117 is described with reference to FIG. 6. FIG. 6 depicts an instance in which only the scanning direction for the shot field S14 in which the error occurred was changed, while the scanning sequence for the subsequent shot fields S15, . . . , were not changed. In such an instance, the scanning direction L2 for shot field S14 and the scanning direction L5 for the next scan field S15 are the same. Consequently, once the shot field S14 has been scanned and exposed along the direction shown by path L2, the scanning sequence must pass through shot field S15 along path L4 and then reverse direction and scan and expose shot field S15 from the opposite side along path L5.

Figure 5:
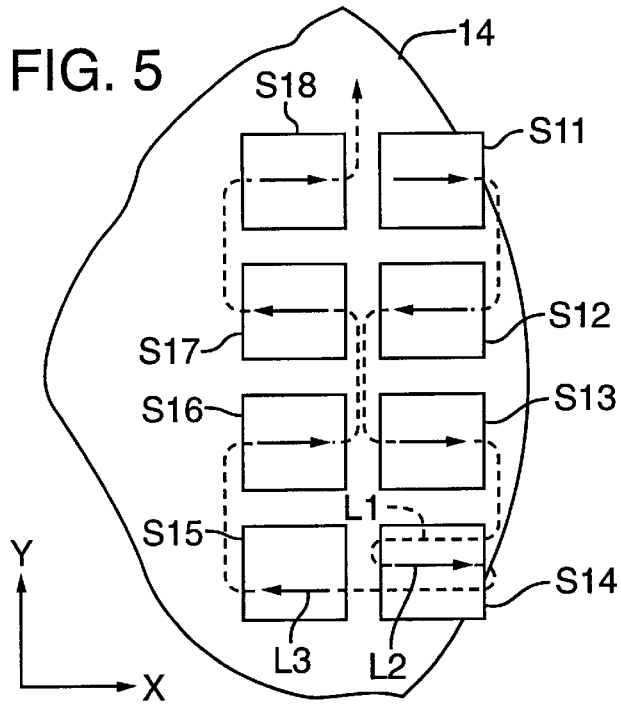
FIG. 5 depicts a representative sequence for exposing multiple shot fields whenever a focusing error is detected.

As can be seen when FIG. 6 is compared with FIG. 5, the scanning sequence in FIG. 6 requires an additional scan of the shot field S15, expending unnecessary time. In addition, since the scanning directions are the same for shot field S14 and shot field S15, which are consecutively scanned and exposed, the scanning directions for the mask 7 must also be the same. In order to accomplish this, after completion of scanning of shot field S14, the mask scanning stage must be returned to the opposite side of the mask without performing an actual exposure scan, which is also a time-wasting operation. In order to improve the throughput of the exposure apparatus by eliminating such wasted time, it is preferable that, if the scanning direction of one shot field (shot field S14, here) is changed, to change the scanning directions of all subsequent shot fields as well.

Figure 7:
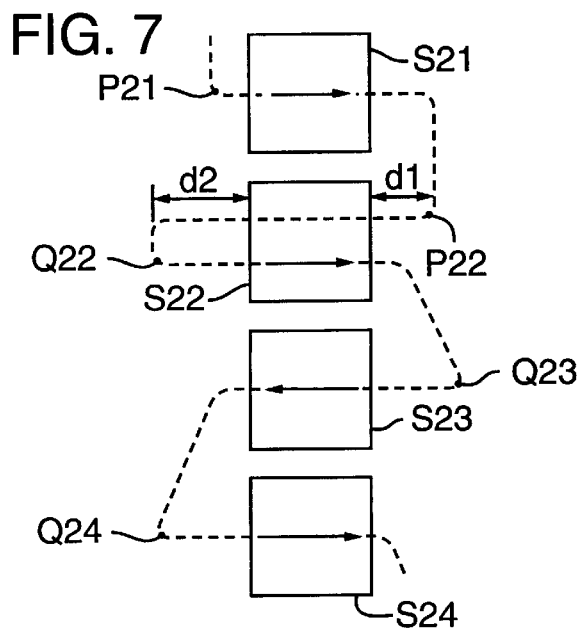
FIG. 7 depicts a representative exposure sequence that occurs when a synchronization error is detected.

Processing in an instance in which a synchronization error occurs and the result at step 116 is "NO" is described with reference to FIG. 7. In FIG. 7, it is assumed that: (a) scanning and exposure of the shot field S21 is completed, (b) prescanning of the prescan distance d1 from the prescan start point P22 has been performed for the next shot field S22, and (c) the mask 7 and the photosensitive substrate 14 are not being driven in complete synchrony even immediately in front of the shot field S22. In such a case, the result at step 116 would be "NO". At this time, in the past, the projection-exposure apparatus would have been stopped due to the detected error. However, with this invention, even if the result at step 116 were "NO," processing would immediately advance to step 118 without stopping the exposure apparatus.

At step 118, the exposure sequence passes through the shot field S22 without exposing it. At the same time, the prescan distance d1 set by the exposure device is changed to d2 (d2>d1), and the scanning directions for all subsequent shot fields are changed to opposite directions. When the processing in step 118 is completed, processing returns to step 113, the shot field S22 is prescanned for a prescan distance d2 from the prescan start point Q22 in the opposite direction to immediately in front of shot field S22, during which time velocity control and position control of the substrate stage and mask stage are performed according to steps 113 and 114.

Synchronization errors between the mask 7 and the photosensitive substrate 14 are frequently remedied by thus lengthening the prescan distance and thereby extending the time so that synchronization can be accomplished. If the result at step 115 and the result at step 116 are both "YES" as a result of the processing in step 118, scanning and exposure of the shot field S22 will be executed from the opposite direction. Scanning and exposure of the subsequent shot fields S23, S24, . . . will be performed with the mask and photosensitive substrate in synchrony by performing the prescanning with the modified prescan distance d2 from their respective prescan start points Q23, Q24, . . . .

An exposure apparatus according to this invention, as described above, provides improved operability in cases where an error occurs after the start of prescanning and before the start of exposure. Thus, error processing can be automatically performed according to the cause of the error, without stopping the exposure apparatus. By changing the scanning sequence subsequent to the error, decreases in throughput due to changing the scanning direction to the opposite direction for the shot field for which the error occurred can be kept to a minimum.

Whereas the invention has been described in connection with a preferred embodiment, it will be understood that the invention is not limited to that embodiment. On the contrary, the invention is intended to encompass all modifications, alternatives, and equivalents as may be included within the spirit and scope of the invention as defined by the appended claims.

What is claimed is:

1. A method for manufacturing a scanning-type exposure apparatus that transfers a pattern, defined on a mask, onto each of a plurality of transfer regions on a substrate, the method comprising the steps:

(a) providing an illumination light source that illuminates a pattern defined on the mask with an illumination light;

(b) providing a stage, arranged on an axis of the illumination light, that moves at least one of the mask and substrate in a plane orthogonal to the axis in order to scanningly expose the pattern sequentially onto the transfer regions on the substrate with the illumination light, each exposure of a transfer region being performed at an exposure position;

(c) providing a detector that detects an abnormality in the scanning exposure apparatus during a preparatory period extending from starting a movement of the stage to effect movement of a predetermined transfer region, to be subsequently exposed, in a predetermined direction to the exposure position, to a moment when the predetermined transfer region arrives at the exposure position for exposure; and (d) providing a stage controller and electrically connecting the stage controller to the detector and to the stage, the stage controller being operable to maintain a continuous movement of the stage in the predetermined direction until at least the predetermined transfer region passes the exposure position, even when the detector detects the abnormality.

2. The method of claim 1, further comprising the step of providing a processor and electrically connecting the processor to the detector, the processor being operable to correct, when the abnormality is detected, an operational sequence of the exposure apparatus that corrects the abnormality while maintaining the movement of the stage in the predetermined direction.

3. The method of claim 2, further comprising the step of providing a projection-optical system operable to transmit light passing through an irradiated region on the mask and form an image of the irradiated region on a transfer surface within a transfer region on the substrate, wherein the detector is operable to detect an abnormality occurring whenever a relationship between a plane on which the image of the irradiated region should be formed and focused by the projection-optical system and the transfer surface of the substrate along the optical axis of the illumination light is not a predetermined relationship.

4. The method of claim 2, wherein the processor controls a scanning direction of the substrate relative to the illumination light during scanning exposure of the substrate.

5. The method of claim 4, wherein:

the scanning direction is pre-set in the scanning-type exposure apparatus; and the processor is operable to change the scanning direction to a direction opposite the pre-set scanning direction.

6. The method of claim 5, wherein:

the scanning direction relative to the illumination light is set during exposure of each respective transfer region; and the processor is operable to change, after detection of the abnormality, the scanning direction for all subsequent transfer regions to a respective direction opposite the respective set direction.

7. The method of claim 1, wherein:

the stage includes a mask stage that moves and scans the mask relative to the illumination light, and a substrate stage that moves and scans the substrate relative to the illumination light;

the mask stage and substrate stage are electrically connected to the stage controller; and the mask stage and the substrate stage are operable to move synchronously during scanning exposure.

8. The method of claim 7, further comprising the step of providing a projection-optical system operable to transmit light passing through the irradiated region on the mask and form an image of the irradiated region on a transfer surface of the substrate, wherein the mask stage causes the mask to scan an illumination field on the mask, and the substrate stage causes the substrate to scan an exposure field that is conjugate with the illumination field about the projection-optical system.

9. The method of claim 7, wherein the detector is operable to produce an error signal whenever the mask stage and the substrate stage are not synchronously scanning relative to each other.

10. The method of claim 9, wherein the detector is operable to produce a respective error signal whenever at least one of the following conditions arises: (1) a positional synchrony between the mask stage and the substrate stage does not exist, and (2) a scanning-velocity synchrony between the mask stage and the substrate stage does not exist.

11. The method of claim 10, wherein the detector comprises a maskstage position detector operable to detect a position of the mask stage and a substrate-stage position detector operable to detect a position of the substrate stage, the detector being further operable to detect a respective stage-position error based on outputs from the mask- and substrate-stage position detectors.

12. The method of claim 11, wherein the detector converts the outputs from the mask- and substrate-stage position detectors into respective stage-velocity data, and compares the two stage-velocity data.

13. The method of claim 6, wherein the processor is operable to control a pre-scan period which is a scanning period extending from a moment when the scanning movement of stage begins until a moment when transfer of the pattern onto the substrate begins.

14. The method of claim 13, wherein a scanning distance is set during the pre-scan period, and the processor is operable to change the scanning distance so that it is longer than the set scanning distance.

15. The method of claim 14, wherein:

the scanning distance for each transfer area is pre-set; and the processor is operable to change, after detection of the abnormality, the scanning distance for all the transfer regions from the respective set distances.

16. The method of claim 13, wherein the processor is operable to control the scanning direction during scanning exposure of the substrate.

17. The method of claim 16, wherein:

the scanning direction relative to the illumination light is pre-set; and the processor is operable to change the scanning direction to a direction opposite the pre-set scanning direction.

18. The method of claim 1, wherein the scanning-type exposure apparatus is operable to prevent exposure of a pattern to a particular transfer region on the substrate whenever an abnormality has been detected with respect to exposure of the particular transfer region.

19. The method of claim 18, wherein the scanning-type exposure apparatus is operable, whenever an abnormality is detected in association with a first scanning of a particular transfer region, to inhibit actual transfer of the mask pattern to the particular transfer region during the first scanning.

20. The method of claim 19, wherein the scanning-type exposure apparatus is operable to perform a transfer of the pattern to the particular transfer region when the particular transfer region is scanned a second time.

21. The method of claim 20, wherein exposure of the particular transfer region during the second scanning is in a scanning direction that is opposite to a scanning direction during the first scanning.

22. A method for performing a scanning exposure that transfers a pattern, defined on a mask, onto each of a plurality of transfer regions on a substrate, the method comprising the steps:

(a) illuminating the pattern of the mask with an illumination light;

(b) scanningly moving at least one of the mask and the substrate in a plane orthogonal to an axis of the illumination light and relative to the illumination light to scanningly expose the pattern sequentially onto the transfer regions on the substrate with the illumination light, each exposure of a transfer region being performed at an exposure position;

(c) detecting an abnormality in the scanning exposure during a pre-scan period, the pre-scan period extending from starting a movement of a predetermined transfer region, to be subsequently exposed, in a predetermined direction to the exposure position, to a moment when the predetermined transfer region arrives at the exposure position for exposure; and (d) during and after detecting the abnormality, maintaining a continuous movement of at least one of the mask and substrate in the predetermined direction until at least the predetermined transfer region passes the exposure position.

23. The method of claim 22, further comprising the step, after detecting the abnormality and while continuing the scanning movement, of performing a predetermined routine to correct the abnormality.

24. The method of claim 23, wherein the abnormality comprises a condition in which a relationship between a plane on which a focused image of the pattern should be formed and an actual transfer surface of the substrate along the optical axis is not a predetermined relationship.

25. The method of claim 24, wherein the predetermined routine comprises changing a predetermined scanning direction, of the substrate relative to the illumination light during scanning exposure of the substrate, to an opposite scanning direction.

26. The method of claim 22, wherein, during exposure, the mask and the substrate move synchronously as the mask is scanned across an illumination field on the mask and the substrate is scanned across an exposure field conjugate with the illumination field about a projection-optical system.

27. The method of claim 26, wherein the abnormality is a condition in which the mask and substrate are not being scanningly moved synchronously with each other.

28. The method of claim 27, further comprising the step, after detecting the abnormality and while continuing the scanning movement, of performing a predetermined routine to correct the abnormality, the predetermined routine comprising changing a predetermined scanning distance, during the pre-scan period, into a distance that is longer than the predetermined scanning distance.

29. The method of claim 22, wherein, whenever an abnormality is detected in association with a first scanning of a particular transfer region, actual transfer of the mask pattern to the particular transfer region is inhibited during the first scanning.

30. The method of claim 29, wherein:

the mask pattern is transferred to the particular transfer region when the particular transfer region is scanned a second time; and the second scanning of the particular transfer region is in a direction opposite to a direction of the first scanning.

31. A method for fabricating a micro-device by transferring a mask pattern onto the substrate using the method of claim 22.

32. A scanning-exposure apparatus that transfers a pattern defined on a mask onto each of a plurality of transfer regions on a substrate, the apparatus comprising:

(a) an illumination light source that illuminates a pattern defined on the mask with an illumination light;

(b) a stage, arranged on an axis of the illumination light, that moves at least one of the mask and substrate relative to the illumination light so as to position a transfer region on the substrate at an exposure position for transfer of the pattern from the mask to the transfer region;

(c) a detector that detects an error in the scanning exposure apparatus during a period extending from starting a movement of the stage to effect movement of a predetermined transfer region, to be subsequently exposed, in a predetermined direction to the exposure position, to a movement when the predetermined transfer region arrives at the exposure position; and (d) regardless of the detection of error, the stage maintaining a continuous movement in predetermined direction until at least the predetermined transfer region passes the exposure position.

33. The apparatus of claim 32, further comprising a processor electrically connected to the detector and the stage, the processor being operable, when the error is detected, to correct the error by performing a predetermined routine while maintaining the continuous movement of the stage.

34. The apparatus of claim 33, wherein the detector is operable to detect the error whenever a relationship between a plane on which a focused image of the pattern should be formed and a transfer surface of the substrate along an optical axis of the illumination light is not a predetermined relationship.

35. The apparatus of claim 34, operable to perform scanning exposure of the substrate in a predetermined scanning direction relative to the illumination light, wherein the processor is operable to change the scanning direction into a direction opposite the predetermined scanning direction.

36. The apparatus of claim 32, wherein:

the stage comprises a mask stage that scanningly moves the mask relative to the illumination light and a substrate stage that scanningly moves the substrate relative to the illumination light;

the mask stage and the substrate stage move synchronously during exposing; and the apparatus further comprises a projection-optical system situated and configured to project an image of the pattern onto the substrate, during which projection the mask stage scans an illumination field on the mask and the substrate stage scans an exposure field, conjugate with the illumination field about the projection-optical system, on the substrate.

37. The apparatus of claim 36, wherein the detector is operable to detect an error arising whenever the mask and substrate are not undergoing synchronous scanning motion.

38. The apparatus of claim 37, wherein:

a predetermined scanning distance during a pre-scan period, extending from beginning scanning movement of the mask and substrate to beginning actual transfer of the pattern onto the substrate, is set by the apparatus; and the processor is operable to change the scanning distance into a longer distance than the predetermined distance.

39. The apparatus of claim 32, wherein, whenever an abnormality is detected in association with a first scanning of a particular transfer region, the apparatus inhibits actual transfer of the mask pattern to the particular transfer region during the first scanning.

40. The apparatus of claim 39, wherein:

the mask pattern is transferable by the apparatus to the particular transfer region when the particular transfer region is scanned a second time; and the second scanning of the particular transfer region is in a direction opposite to a direction of the first scanning.

* * * * *

UNITED STATES PATENT AND TRADEMARK OFFICE
CERTIFICATE OF CORRECTION

PATENT NO. : 6,028,659
DATED : February 22, 2000
INVENTOR(S) : Yasutoshi Kaneko

It is certified that error appears in the above-identified patent and that said Letters Patent is hereby corrected as shown below:

Column 11, line 40, claim 11, "maskstage" should be --mask-stage--.

Column 13, line 42, claim 32, --the-- should be inserted between "of" and "error".

Signed and Sealed this

Fifteenth Day of May, 2001

Attest:

NICHOLAS P. GODICI

*Attesting Officer*     *Acting Director of the United States Patent and Trademark Office*